United States Patent
Takeya et al.

(10) Patent No.: US 9,153,789 B2
(45) Date of Patent: Oct. 6, 2015

(54) TRANSISTOR WITH SOURCE/DRAIN ELECTRODES ON PEDESTALS AND ORGANIC SEMICONDUCTOR ON SOURCE/DRAIN ELECTRODES, AND METHOD FOR MANUFACTURING SAME

(75) Inventors: Junichi Takeya, Kashiwa (JP); Takafumi Uemura, Toyonaka (JP); Mayumi Uno, Izumi (JP)

(73) Assignee: OSAKA UNIVERSITY, Osaka (JP)

( * ) Notice: Subject to any disclaimer, the term of this patent is extended or adjusted under 35 U.S.C. 154(b) by 0 days.

(21) Appl. No.: 14/237,055

(22) PCT Filed: Jul. 18, 2012

(86) PCT No.: PCT/JP2012/068219
§ 371 (c)(1),
(2), (4) Date: Feb. 4, 2014

(87) PCT Pub. No.: WO2013/018546
PCT Pub. Date: Feb. 7, 2013

(65) Prior Publication Data
US 2014/0191224 A1    Jul. 10, 2014

(30) Foreign Application Priority Data
Aug. 4, 2011    (JP) ................................ 2011-171136

(51) Int. Cl.
*H01L 51/05* (2006.01)
*H01L 51/10* (2006.01)
*H01L 29/778* (2006.01)
*H01L 29/16* (2006.01)

(52) U.S. Cl.
CPC ........ *H01L 51/0545* (2013.01); *H01L 51/0516* (2013.01); *H01L 51/105* (2013.01); *H01L 29/1606* (2013.01); *H01L 29/778* (2013.01)

(58) Field of Classification Search
CPC . H01L 51/0545; H01L 51/105; H01L 29/778; H01L 29/1606
USPC .............................................. 257/40; 438/99
See application file for complete search history.

(56) References Cited

U.S. PATENT DOCUMENTS

2008/0012151 A1    1/2008   Kemppainen et al.
2010/0252801 A1*  10/2010   Sekaric et al. .................. 257/9

FOREIGN PATENT DOCUMENTS

JP    S61-133667    6/1986
JP    S61-234078    10/1986

(Continued)

OTHER PUBLICATIONS

Vikram C. Sundar et al.: "Elastomeric Transistor Stamps: Reversible Probing of Charge Transport in Organic Crystals", Science, Mar. 12, 2004, vol. 303, No. 5664, pp. 1644-1646, www.sciencemag.org.

*Primary Examiner* — Peter Bradford
(74) *Attorney, Agent, or Firm* — Hamre, Schumann, Mueller & Larson, P.C.

(57) ABSTRACT

An organic transistor is provided with: an insulating substrate; a pair of insulating pedestals (2, 3) that are arranged spaced apart from each other on the substrate and that form respectively raised flat surfaces; a source electrode (4) provided on the raised flat surface formed on one of the pedestals; a drain electrode (5) provided on the raised flat surface formed on the other pedestal; a gate electrode (6) provided on the substrate between the pair of pedestals; and an organic semiconductor layer (7) arranged in contact with the upper surfaces of the source electrode and the drain electrode. The gate electrode and the lower surface of the organic semiconductor layer vertically oppose each other across a gap region (8), and the side surfaces of the pedestals facing the gap region are shaped such that the lower side edges recede apart from the gate electrode with respect to the upper side edges. A contact resistance between the source and drain electrodes and the organic semiconductor layer is reduced, high-speed response performance is enhanced by shortening the channel, and short-circuits between the source and drain electrodes and the gate electrode, which accompany shortening of the channel, can be avoided.

12 Claims, 8 Drawing Sheets

(56) References Cited

FOREIGN PATENT DOCUMENTS

| JP | S62-141777 | 6/1987 |
| JP | 2006-041219 | 2/2006 |
| JP | 2007-115805 | 5/2007 |
| JP | 2007-527106 | 9/2007 |
| JP | 2007-266355 | 10/2007 |
| JP | 2010-135542 | 6/2010 |

* cited by examiner

TRANSISTOR WITH SOURCE/DRAIN ELECTRODES ON PEDESTALS AND ORGANIC SEMICONDUCTOR ON SOURCE/DRAIN ELECTRODES, AND METHOD FOR MANUFACTURING SAME

TECHNICAL FIELD

The present invention relates to an organic transistor using an organic semiconductor for the active layer. In particular, the present invention relates to an organic transistor having a device structure suitable for improving the response performance by shortening the channel length.

BACKGROUND ART

Examples of organic semiconductor materials exhibiting a mobility equivalent to that of amorphous silicon have been reported recently. An organic transistor using an organic semiconductor for the active layer does not require a manufacturing process at an extremely high temperature, and thus it is possible to manufacture a device easily with manufacturing equipment that is supplied at a low cost and that imposes a low environmental loading. Due to such advantages, the organic transistor is expected to be used as a semiconductor device to support the new electronic industry.

For improving the response speed of the organic transistor, it is indispensable to shorten the channel length as the distance between the source electrode and the drain electrode. However, when the channel length is shortened, the contact resistance between the organic semiconductor layer and the source and drain electrodes is increased in the proportions with respect to the channel resistance, and thus there has been a limit in improving the operation speed of the transistor even by shortening the channel length. For this reason, the response performance of an atmospherically-stable organic transistor reported up to now is still as low as the range from about 10 kHz to about 1 MHz.

The influences of the contact resistance between the organic semiconductor layer and the source and drain electrodes in a case where the channel length is shortened will be described in more detail below with reference to FIG. 10. FIG. 10 is a cross-sectional view showing an example of a typical structure of an organic transistor. In this organic transistor, a gate electrode 32 is provided on an insulating substrate 31, and a gate insulating layer 33 is formed thereon for coating the upper part. On the gate insulating later 33, a source electrode 34 and a drain electrode 35 are provided to be located at the both sides of the gate electrode 32. On the upper part of each of the source electrode 34 and the drain electrode 35, an organic semiconductor layer 36 is provided.

A cutoff frequency $f_c$ is the maximum frequency to which this organic transistor can respond, and it is defined in general as a frequency where the relationship between the gate current $I_G$ and the drain current $I_D$ becomes $|I_G|=|I_D|$.

Here, the on-state of the organic transistor is reviewed by using a so-called capacitor model of an aspect where the gate insulating layer 33 is sandwiched at both sides by the gate electrode 32 and the organic semiconductor layer 36 with a carrier injected. The impedance Z of the capacitor having a capacitance C is expressed as $Z=1/(j \cdot \omega \cdot C)$ (where j is an imaginary unit, and $\omega$ is an angular frequency). When the gate capacitance is $C_G$ and the gate voltage to be applied to the gate electrode 32 is $V_G$;

$$|I_G/V_G|=\omega C_G;$$

namely, it can be expressed as follows.

$$|I_G|=\omega C_G|V_G| \quad (1)$$

Next, $|I_D|$ will be mentioned. In the configuration of FIG. 10, the channel length is L, the channel width is W, and the electrical resistance between the source electrode 34 and the drain electrode 35 is represented by R $(=R_{PS}+R_{CH}+R_{PD})$. $R_{PS}$ is a contact resistance generated during an electric charge transfer from the source electrode 34 to the organic semiconductor layer 36; $R_{CH}$ is a channel resistance in the channel when the organic semiconductor layer 36 is in an on-state, and $R_{PD}$ is a contact resistance during an electric charge transfer from the organic semiconductor layer 36 to the drain electrode 35.

Here, an electric conductivity $\sigma$ in a solid is expressed as $\sigma=ne\mu$ where n is an electron density, e is an electron elementary quantity, and $\mu$ is a charge mobility. Taking the above-described capacitor model into consideration, an electric charge ne present around the unit area of the channel is expressed as follows, where $c_i$ is a gate capacitance per channel unit area of the organic transistor in an on-state.

$$ne=c_iV_G$$

When the contact resistance between the organic semiconductor material 36 and the source and drain electrodes 34, 35 is insignificant, it will be as follows.

$$R=R_{CH}=(1/\sigma)\times(L/W)$$

The drain current $I_D$ that flows from the source electrode 34 to the drain electrode 35 can be expressed by Equation (2) below by using $\sigma=ne\mu$ where $V_D$ represents the drain voltage.

$$I_D=V_D/R_{CH}=\sigma(W/L)V_D=(c_iV_G\mu)(W/L)V_D \quad (2)$$

Therefore, from Equation (1) and Equation (2), by substituting $\omega=2\pi f_C$ assuming that $|I_G|=|I_D|$, the equation below is obtained.

$$f_C=\{\mu V_D/(2\pi L^2)\}\times(c_iWL/C_G) \quad (3)$$

$c_iWL$ corresponds to the capacitance at the channel part. The term of $(c_iWL/C_G)$ indicates the ratio of the capacitance at the channel part to the total gate capacitance including parasitic capacitance, which expresses that the response speed is in proportions to this ratio.

It is evident from Equation (3) that in a case where the contact resistance with the electrode is insignificant, the maximum operation frequency can be increased rapidly in proportions to the reciprocal of $L^2$ by shortening the channel length L.

In a case where the contact resistance with the electrode is significant, the apparent mobility $\mu_{eff}$ for which the contact resistance is taken into consideration (hereinafter recited as effective mobility) is defined as satisfying Equation (4) below.

$$I_D=V_D/R=(c_iV_G\mu_{eff})(W/L)V_D \quad (4)$$

When expressing the sum of the contact resistance as $R_P=R_{PS}+R_{PD}$, and using a recitation $R=R_{CH}+R_P$, the relationship between the effective mobility $\mu_{eff}$ and the charge mobility $\mu$ inherent in the material is arranged as in the equation below by use of Equation (2) and Equation (4).

$$\mu_{eff}=\mu/\{1+R_P\times(c_iV_G\mu)\times(W/L)\} \quad (5)$$

In this equation, when the contact resistance $R_P=0$, it can be confirmed that $\mu_{eff}=\mu$.

Further, Equation (5) shows that in a case where the contact resistance exists, the degree that the effective mobility $\mu_{eff}$ is lowered from the inherent $\mu$ is increased along with the channel length L is shortened.

In this case, the cutoff frequency $f_C$ is as follows.

$$f_C=\{\mu_{eff}V_D/(2\pi L^2)\}\times(c_iWL/C_G) \quad (6)$$

This indicates that in a case where the effective mobility $\mu_{\mathit{eff}}$ is lowered accompanying the shortening of channel, it is difficult to raise the operation frequency. Therefore, it is considerably important to construct a short channel device with the influence of the contact resistance reduced as much as possible for the purpose of enhancing the operation speed of the organic transistor.

The device structures of typical organic transistors are classified into two types, i.e., a top contact type and a bottom contact type. The top contact type refers to a structure where a source electrode and a drain electrode are formed on a semiconductor layer at the side opposite to a gate electrode. The bottom contact type refers to a structure as shown in FIG. 10, where a source electrode and a drain electrode are formed at the lower part of a semiconductor layer.

In a case of a top contact type, the path for the drain current is as follows. Namely, the current flows from the source electrode at the upper part through the semiconductor layer in the thickness direction, later it flows through the channel part and then flows again through the semiconductor layer in the thickness direction to reach the drain electrode. Generally in such a case, since the mobility in the thickness direction of the organic semiconductor layer is often lower than the mobility in the channel direction, a technique to form an extremely thin organic semiconductor layer is required. Furthermore, when fabricating a top contact type structure with a short channel length by use of a micromachining process such as photolithography, a photolithography process has to be carried out after fabricating the organic semiconductor layer. However in general, since the organic semiconductor layer frequently is damaged during the photolithography process, the process cannot be employed. As a result, the channel length cannot be shortened sufficiently, thereby making difficult to achieve a high-speed response performance.

In a case of a device structure of a bottom contact type, the thickness direction of the organic semiconductor layer is not included as the path for the drain current, and thus only the source and drain electrodes and the channel plane are taken into consideration. Another advantage is that since an organic semiconductor layer is fabricated after constituting a fine short channel by forming the source and drain electrodes by photolithography, the channel length can be shortened. However in general, there is a problem that in a device fabricated as a bottom contact type, the contact resistance between the electrode and the organic semiconductor is greater in comparison with the case of the top contact type. For this reason, in order to increase the response speed of the transistor, attempts for lowering the contact resistance between an electrode and an organic semiconductor have been made while employing the bottom contact type.

Examples thereof include a method of suppressing a parasitic resistance by forming a self-assembled monolayer (SAM) having a film thickness of several nanometers on a gold electrode that serves as source and drain electrodes; and a technique of coordinating the energy level of the organic semiconductor and the work function of the electrode.

Further, Patent Document 1 discloses employing a gold-based alloy, namely an alloy containing gold in the range not less than 67 atomic % and not more than 97 atomic % for an adhesion layer to be provided between the source and drain electrodes made of gold and the insulating substrate. For the material to form the source and drain electrodes of an organic transistor of p-type operation, gold whose work function is approximate to the HOMO level of the organic transistor is used often. However, as gold has lower adhesion to other materials, a technique of forming an adhesion layer between the gold electrode and the substrate is carried out in general, and it has been pointed out that this adhesion layer causes the parasitic resistance between the source and drain electrodes and the organic semiconductor layer. To cope with this problem, as mentioned above, Patent Document 1 discloses a technique for reducing the parasitic resistance between the organic semiconductor layer and the electrodes by using an alloy including gold as the material of the adhesion layer. However, even in the organic transistor disclosed by Patent Document 1, the effective mobility is still as low as the range of about 0.4 to about 2.2 $cm^2/Vs$.

This is considered to be caused by the presence of a level difference between the upper surfaces of the source and drain electrodes and the upper surface of the gate insulating layer between these electrodes. Namely, the organic semiconductor layer formed in the region of this level difference is deformed in comparison with a layer formed on a flat surface, and thus a disturbance in the molecular orientation occurs, thereby hindering the improvement in mobility. Further, such a deformation in the organic semiconductor layer will cause also an increase in the contact resistance between the organic semiconductor layer and the source and drain electrodes. For this reason, when the channel length is short, the disturbance in the molecular orientation is inevitable, and thus it is difficult to obtain a high effective mobility with a short channel.

For avoiding the deformation of the organic semiconductor layer caused by the level difference and for providing an organic semiconductor layer in a flat state, the employment of the gap structure disclosed by Non-Patent Document 1 can be taken into consideration. The gap structure is one aspect of a bottom contact type device structure. A stepped structure is provided on the insulating substrate, and on this stepped structure a source electrode and a drain electrode are provided respectively and independently. A single crystal organic semiconductor is supported on the source and drain electrodes on the upper surfaces of the level difference, forming the device structure in which the single crystal organic semiconductor bridging the source electrode and the drain electrode is flat.

Between the substrate and the lower surface of the single crystal organic transistor in the area between the source electrode and the drain electrode, a space, i.e., a gap is formed. The gate electrode formed on the substrate between the source and drain electrodes opposes the single crystal organic semiconductor across the gap. The source and drain electrodes are formed respectively on a pair of pedestals formed spaced apart from each other on the substrate, and the gate electrode is formed on the substrate between the pair of pedestals. According to this device structure, the single crystal organic semiconductor opposes the gate electrode across an air layer. Therefore, in comparison with a conventional and typical structure where an insulating solid that composes the gate insulating layer and the organic semiconductor are in contact with each other, it is possible to prevent lowering of the mobility caused by impurities or the like in the interface between the gate insulator and the organic semiconductor. Thus it is possible to calculate with further preciseness the charge mobility inherent in the single crystal organic semiconductor material.

It should be noted, however, that in Non-Patent Document 1, the gap device structure is employed to evaluate the electronic conduction on the organic single crystal interface, but a structure for shortening the channel length so as to allow a high-speed response is not disclosed.

PRIOR ART DOCUMENTS

Patent Documents

Patent Document 1: JP 2010-135542 A
Non-Patent Documents
Non-Patent Document 1: "Elastomeric Transistor Stamps: Reversible Probing of Charge Transport in Organic Crystals", Vikram C. Sundar et al., p. 1644-1646, Science Mar. 12, 2004, Vol. 303

DISCLOSURE OF INVENTION

Problem to be Solved by the Invention

In the gap structure as disclosed in Non-Patent Document 1, a measurement value proximal to the mobility inherent in the organic single crystal material is obtained. And it is possible to obtain a high mobility in a case where the channel length is long. However, since the gap device structure in the Non-Patent Document 1 is employed to evaluate the electronic conduction in the organic single crystal interface, there is no disclosure of the technique or the specific structure for realizing a device structure with a short channel length and a small contact resistance for the purpose of realizing a high-speed transistor response. Further, there is no description of the effect of reducing deformation of the organic semiconductor in the vicinity of the electrodes.

In an attempt to shorten the channel length in the gap structure, a problem will occur. Namely, a short circuit occurs easily between the source electrode and the gate electrode, or between the drain electrode and the gate electrode. When shortening the channel length, it is required simultaneously to lower the level difference of the stepped structure for forming the gap structure for the purpose of establishing a so-called gradual channel approximation. Namely, it is necessary not only to shorten the channel length but to scale down the entire device structure.

Here, in fabricating a transistor employing the gap structure, it is desirable to form the wall surface of the level difference with a favorable verticality and to vapor-deposit an electrode metal in one direction from right above the level difference, thereby forming simultaneously the source and drain electrodes and the gate electrode in a batch vapor deposition. Therefore, if the level difference is to decrease, it is necessary to control the direction of vapor-depositing the electrode metal more strictly to one vertical direction. However, as it is extremely difficult to realize it from a practical viewpoint, there is a considerable risk of an electric short circuit occurring between the upper and the lower surfaces of the level difference.

Therefore, with the foregoing in mind, it is an object of the present invention to provide an organic transistor in which a contact resistance between the source and drain electrodes and the organic semiconductor layer is reduced even if the channel length is short, so as to improve the transistor response performance with the shortened channel, while being capable of avoiding occurrence of short circuit between the source and drain electrodes and the gate electrode which may accompany the shortened channel.

Means for Solving Problem

For solving the above-mentioned problems, an organic transistor of the present invention is characterized in that it includes: an insulating substrate; a pair of insulating pedestals arranged spaced apart from each other on the substrate and forming respectively raised flat surfaces; a source electrode provided on the raised flat surface formed on one of the pedestals; a drain electrode provided on the raised flat surface formed on the other pedestal; a gate electrode provided on the substrate between the pair of pedestals; and an organic semiconductor layer arranged in contact with the upper surface of the source electrode and the upper surface of the drain electrode. The gate electrode and the lower surface of the organic semiconductor layer oppose each other vertically across a gap region, and the side surfaces of the pedestals facing the gap region are shaped such that the lower side edges recede apart from the gate electrode with respect to the upper side edges.

Further, a method for manufacturing an organic transistor of the present invention includes: forming on an insulating substrate a pair of insulating pedestals that are spaced apart from each other and that form respectively raised flat surfaces; forming a source electrode on the raised flat surface formed on one of the pedestals and forming a drain electrode on the raised flat surface formed on the other pedestal, and forming a gate electrode on the substrate between the pair of pedestals; fabricating a semiconductor layer member having the organic semiconductor layer formed on a support substrate; and mounting the semiconductor layer member in contact with the upper surface of the source electrode and the upper surface of the drain electrode so that the surface of the organic semiconductor layer opposes the source electrode and the drain electrode, thereby forming a gap region between the gate electrode and the lower surface of the organic semiconductor layer; wherein in the step of forming the pedestals, the side surfaces of the pedestals facing the gap region is shaped such that the lower side edges recede apart from the gate electrode with respect to the upper side edges.

Effects of the Invention

According to the present invention, by employing a structure such that an organic semiconductor layer is mounted on a source electrode and a drain electrode, providing a gap region between a gate electrode and the organic semiconductor layer, the flatness of the organic semiconductor layer in the vicinity of the source and drain electrodes is ensured sufficiently. As a result, the contact resistance between the source and drain electrodes and the organic semiconductor layer is reduced and thus favorable high-speed response performance can be realized even if the channel length is short. In addition to that, since the side surface of each pedestal in the gap region is shaped such that the bottom surface side recedes apart from the gate electrode with respect to the raised flat surface side, the short circuit between the source and drain electrodes and the gate electrode, which accompanies employment of the gap structure, can be avoided easily.

DESCRIPTION OF THE INVENTION

The organic transistor of the present invention is based on the above-mentioned configuration and can be embodied as mentioned below.

Namely in the configuration, it is possible that the side surfaces of the pedestals facing the gap region form reverse tapers from the lower side edges toward the upper side edges. In this case, it is possible that each of the pedestals has a shape of a reverse mesa in a channel direction cross section including a direction of a channel between the source electrode and the drain electrode.

Furthermore in the configuration, it is possible that the side surface of each of the pedestals facing the gap region has an area of a certain height on the lower edge side including a part opposing the gate electrode, which area recedes stepwise with respect to the upper edge side area, thereby forming a reverse staircase.

Furthermore in the configuration, it is possible that a semiconductor layer member constituted by forming the organic semiconductor layer on a support substrate is provided and that the semiconductor layer member is mounted on the source electrode and the drain electrode in a state where the surface of the organic semiconductor layer opposes the source electrode and the drain electrode.

Furthermore in the configuration, it is possible that at least a part of the gap region is formed of an insulating solid, and the insulating solid has a permittivity greater than 1.

Furthermore in the configuration, it is possible that the gap region is entirely formed of an ionic liquid. In an alternative configuration, it is possible that at least a part of the gap region to be in contact with the organic semiconductor layer is formed of the insulating solid, and the part other than the insulating solid can be formed of an ionic liquid.

Furthermore in the configuration, it is possible that a channel length L as the distance between the source electrode and the drain electrode is 20 μm or less. In this case, it is possible that a height d of the pedestals satisfies a relationship of d≤L/2 μm with respect to the channel length L.

In the method for manufacturing an organic transistor of the present invention, it is possible to form the source electrode, the drain electrode and the gate electrode simultaneously by a batch film formation on the pedestals and on the substrate. Thereby, it is possible to simultaneously form the source and drain electrodes and the gate electrode while avoiding the risk of short circuit. It is advantageous for improving efficiency in fabrication.

Hereinafter, embodiments of the present invention will be described with reference to the attached drawings.

Embodiment 1

Figure 1:
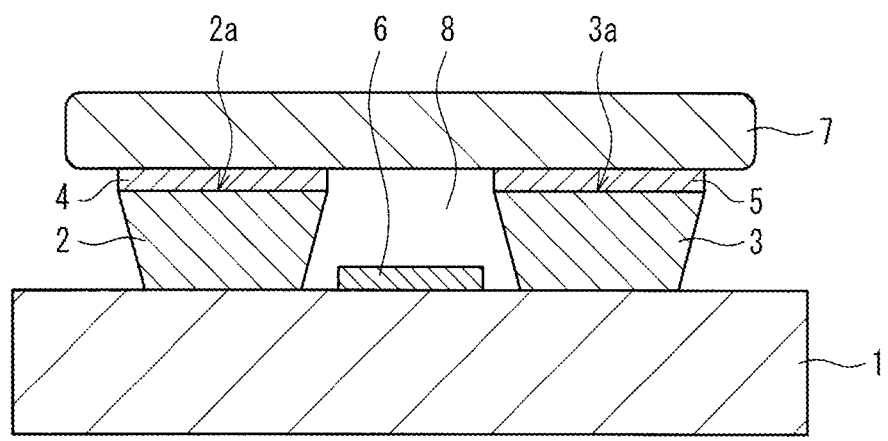
FIG. 1 is a cross-sectional view showing a structure of an organic transistor according to Embodiment 1.

FIG. 1 is a cross-sectional view showing a structure of an organic transistor according to Embodiment 1. This organic transistor has a pair of pedestals 2, 3 formed on an insulating substrate 1. The pedestals 2, 3 form raised flat surfaces 2a, 3a having a level difference with respect to the upper surface of the substrate 1. And the pedestals 2, 3 oppose each other in a state spaced apart from each other.

A source electrode 4 is provided on the raised flat surface 2a, while a drain electrode 5 is provided on the raised flat surface 3a. A gate electrode 6 is provided on the substrate 1 in the space between the pedestals 2 and 3. An organic semiconductor layer 7 is arranged in contact with the upper surfaces of the source electrode 4 and the drain electrode 5. In this configuration, the space surrounded by the upper surface of the substrate 1, the side surfaces of the pedestals 2, 3, and the lower surface of the organic semiconductor layer 7 forms a gap region 8. Therefore, a gap structure where the gate electrode 6 formed on the substrate 1 opposes the organic semiconductor layer 7 across the gap region 8 is formed. Although the gap region 8 in the configuration shown in FIG. 1 is an air layer, the gap region can be constituted by filling with a gas such as dry nitrogen, or as mentioned below, it can be configured by filling at least partially with an insulating solid or the like.

The cross section of FIG. 1 shows a cross section including the channel direction between the source electrode 4 and the drain electrode 5. In this cross section, each of the pedestals 2, 3 has a reverse mesa structure. A reverse mesa structure indicates a vertically reversed structure of a forward mesa structure having a trapezoidal cross section, i.e., a structure having a cross section of a reverse trapezoid. In other words, the side surfaces of the pedestals 2, 3 facing the gap region 8 form inclined surfaces that incline from their lower side edges (bottom surface side, namely the substrate 1 side) toward the upper side edges (top surface side, namely the raised flat surfaces 2a, 3a side), and thus they form reverse tapers, namely the lower side edges recede apart from the gate electrode 6 with respect to the upper side edges.

The shape of the pedestals 2, 3 is employed to provide the side surfaces of the pedestals 2, 3 facing the gap region 8 with the shape characteristic to the present invention, namely, the shape in which the lower side edges recede apart from the gate electrode 6 with respect to the upper side edges. This shape is effective in avoiding a short circuit between the source and drain electrodes 4, 5 and the gate electrode 6, which accompanies the attempt to shorten the channel in the structure where the gate electrode 6 opposes the organic semiconductor layer 7 across the gap region 8.

Namely, in a transistor having a gap structure, the gate electrode 6 is formed by a deposition through the space between the upper surfaces (raised flat surfaces 2a, 3a) of the pedestals 2, 3. On the other hand, when reducing the size of the entire device for the purpose of employing a structure with a short channel length, there is a necessity of decreasing simultaneously also the distance between the substrate 1 and the organic semiconductor 7, i.e., the height of the pedestals 2, 3. Therefor, the gate electrode 6 to be formed on the substrate 1 between the pedestals 2, 3 is apt to be formed as a film bridged over the raised flat surfaces 2a, 3a. As a result, the gate electrode 6 will be connected easily to the source and drain electrodes 4, 5 to be formed on the raised flat surfaces 2a, 3a.

This causes the short circuit that occurs accompanying the shortening of the channel length. In particular, when the side surfaces of the pedestals 2, 3 are vertical or trapezoidal having a forward taper (forward mesa), the electrode layers to be formed on the raised flat surfaces 2a, 3a and the electrode layer on the substrate 1 between the pedestals 2, 3 will be connected easily to each other. In contrast, if the side surfaces of the pedestals 2, 3 are shaped as reverse tapers or the like as mentioned above, the films to be formed will be rarely connected to each other, and thus the electric short circuit can be avoided.

For obtaining the effect of avoiding the electric short circuit, it is not always required that the pedestals 2, 3 have a reverse mesa shape as a whole. Namely, there is no particular limitation for the shape of the pedestals 2, 3 as long as the side surfaces facing the gap region 8 are reversed tapers. Further, for preventing short circuit of the electrodes, the shape of the side surfaces of the pedestals 2, 3 is not limited to the reverse taper. The effect of preventing an electric short circuit can be obtained with any other shapes as long as the side surfaces of the pedestals 2, 3 facing the gap region 8 are shaped such that the lower side edges recede apart from the gate electrode 6 with respect to the upper side edges.

For the organic semiconductor layer 7, either an independent organic semiconductor layer fabricated in advance or a product prepared by forming an organic semiconductor layer on a support substrate is used. And by bonding the organic semiconductor layer 7 onto the source and drain electrodes 4, 5 formed on the substrate 1, an organic transistor of the above-mentioned configuration can be fabricated. It is required that the organic semiconductor layer 7 be fabricated such that the lower surface can maintain a predetermined flatness when the organic semiconductor layer 7 is mounted on the pedestals 2, 3. Meanwhile, in a case of improving the response performance by shortening the channel, since the length of the space between the pedestals 2, 3 becomes extremely short, the flatness of the lower surface can be maintained easily.

According to the configuration of this embodiment as mentioned above, the organic semiconductor layer 7 formed flat is mounted on the source and drain electrodes 4, 5 by employing the gap structure. Therefore, in comparison with the structure where the organic semiconductor layer is formed on the surface of the stepped part, the disturbance in the molecular orientation of the organic semiconductor layer 7 in the vicinity of the source and drain electrodes 4, 5 is minimized. Thereby, the contact resistance between the source and drain electrodes 4, 5 and the organic semiconductor layer 7 is reduced considerably, and thus an organic transistor that has a short channel length and that is still capable of providing a high-speed response performance is obtained. Further, the electric short circuit between the source and drain electrode 4, 5 and the gate electrode 6 which may occur as a result of employment of the gap structure can be avoided easily because the side surfaces of the pedestals 2, 3 facing the gap region 8 are shaped so that their lower side edges recede apart from the gate electrode 6 with respect to the upper side edges.

The property of the organic transistor having the configuration of the present embodiment was compared with that of an organic transistor having a conventional configuration. The results are mentioned with reference to FIGS. 2 and 3. In these figures, the x-axes indicate the channel length (μm) and the y-axes indicate the effective mobility $\mu_{eff}$ (cm$^2$/Vs).

In the comparative experiments, Examples 1 and 2 were prepared for the organic transistor according to the present embodiment. Example 1 refers to a p-type organic transistor using an organic semiconductor layer of rubrene crystal. Example 2 refers to an n-type organic transistor using an organic semiconductor layer of PDIF-CN$_2$ (fluorocarbon-substituted dicyanoperylene-3,4:9,10-bis(dicarboximide)) crystal. For the Comparative examples 1 and 2, transistors employing the bottom contact structure as shown in FIG. 10 were fabricated respectively by using the organic crystals similar to those of Examples 1 and 2 for the organic semiconductor layers.

For the structure of the organic transistors of Examples, the structure as shown in FIG. 1 was used, so that the bottom contact type structure was employed similarly to Comparative examples. A glass substrate was used for the substrate 1, and a photoresist that can be shaped to a reverse taper was used for the material of the pedestals 2, 3. And gold electrodes were employed for all of the source, drain and gate electrodes 4, 5, 6. As to the respective dimensions, the channel length L was varied in the range of 3 μm to 200 μm (Example 1) and in the range of 3 μm to 50 μm (Example 2), and in each of these examples, the channel width W was set to 450 μm and the height of the pedestals 2, 3 was set to 1 μm.

Figure 10:
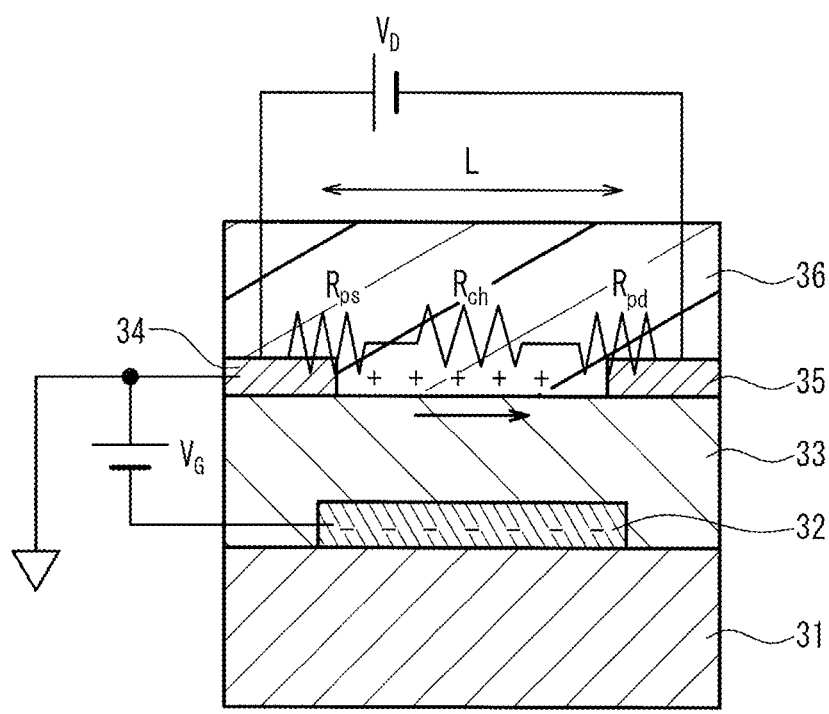
FIG. 10 is a cross-sectional view for explaining problems in an organic transistor of a conventional example.

In each of the Comparative examples, a glass substrate was used for the substrate 31, a silicon oxide film was used for the gate insulator 33, and gold electrodes were used for all of the source, drain and gate electrodes 32, 34, 35 in the structure of FIG. 10. The gate insulating layer 33 was made of a fluorine-based amorphous resin, and the film thickness of the gate insulating layer 33 was set to 200 nm. Except for these, the dimensions are the same as those of Examples. The channel length L was varied in the range of 3 μm to 200 μm (Comparative example 1) and in the range of 3 μm to 50 μm (Comparative example 2), and the channel width was set to 450 μm.

Measurement of the transistor property was carried out in a nitrogen-substituted glove box in order to avoid influence of the atmosphere. The drain voltage $V_D$ was set to 1 V, and the gate voltage $V_G$ was varied in the range of 10 V to −10 V so as to obtain the value of transconductance. The value of transconductance corresponds to the change $\Delta I_D/\Delta V_G$ of the drain current $I_D$ at the time of changing the gate voltage $V_G$. By inserting the obtained value of transconductance, the channel length L, the channel width W, the drain voltage $V_D$ and the value $c_i$ of the channel capacitance into Equation (4), the value of the effective mobility $\mu_{eff}$ including the influence of the contact resistance was calculated.

Figure 2:
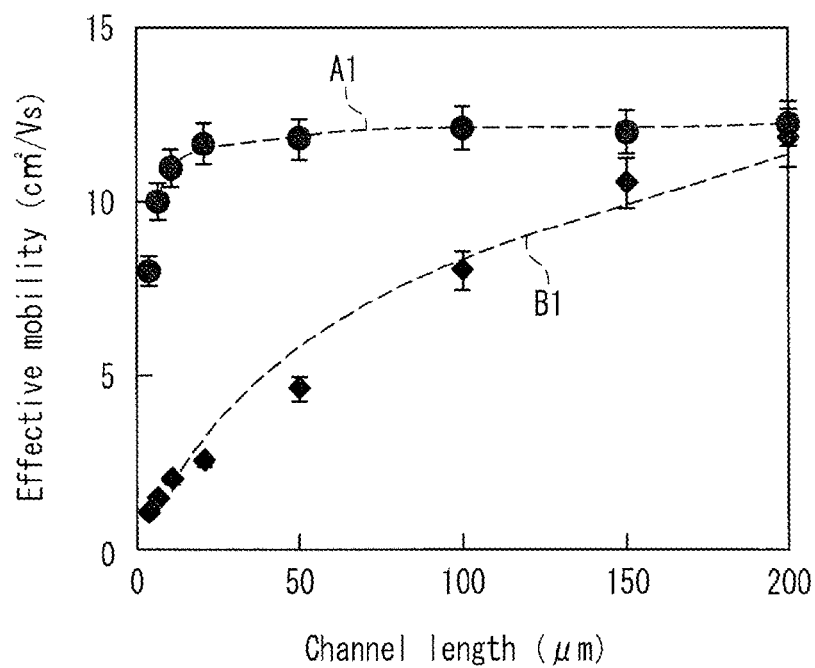
FIG. 2 is a graph showing the property in Example 1 for the organic transistor, in comparison with a conventional example.

In FIG. 2, the property of the p-type organic transistor of Example 1 using rubrene is illustrated as a curve A1. The property of the organic transistor of Comparative example 1 is illustrated as a curve B1. As evidently shown in this figure, the organic transistor of Example 1 illustrated as the curve A1 exhibits a high effective mobility $\mu_{eff}$ of about 10 cm$^2$/Vs even when the channel length was shortened to 10 μm. In contrast, in Comparative example 1 illustrated as the curve B1, the effective mobility $\mu_{eff}$ is lower than 5 cm$^2$/Vs even at the channel length of 50 μm. When the channel length is shortened to 20 μm or less, the effective mobility $\mu_{eff}$ is lowered to a value of less than 2.5 cm$^2$/Vs. When the channel length was 200 μm, in both structures of Example 1 and Comparative example 1, the effective mobility $\mu_{eff}$ was substantially equivalent to each other, namely, 12 cm$^2$/Vs.

Figure 3:
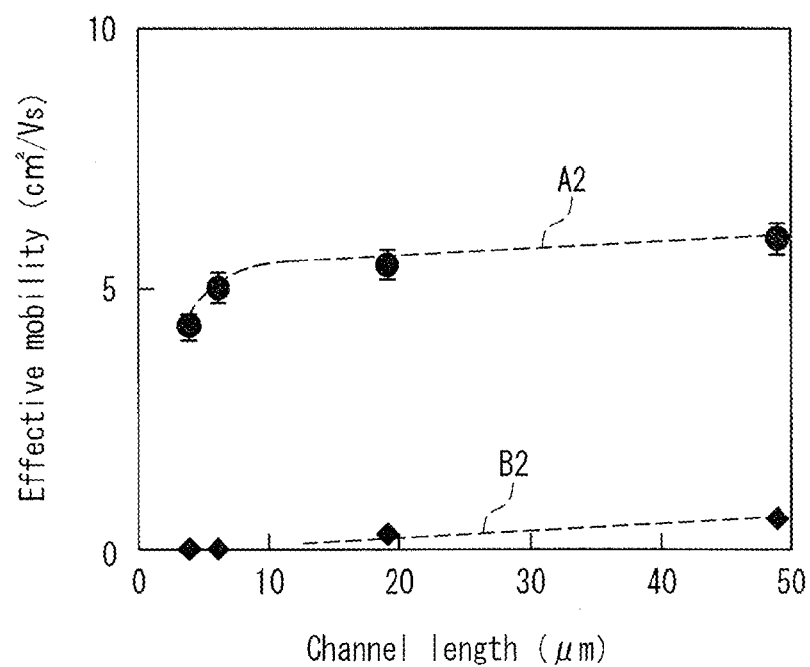
FIG. 3 is a graph showing the property in Example 2 for the organic transistor, in comparison with a conventional example.

The property of the n-type organic transistor in Example 2 using PDIF-CN$_2$ is illustrated in FIG. 3 as a curve A2. The property of the organic transistor of Comparative example 2 is illustrated as a curve B2. Also in the comparison illustrated in this figure, the organic transistor of Example 2 illustrated as the curve A2 exhibits a high effective mobility $\mu_{eff}$ exceeding 5 cm$^2$/Vs even when the channel length is shortened to 10 μm. In contrast, in the case of Comparative example 2 illustrated as the curve B2, the effective mobility $\mu_{eff}$ is lower than 1 cm$^2$/Vs even when the channel length is 50 μm. When the channel length is shortened to 20 μm or less, the effective mobility $\mu_{eff}$ is lowered further.

As mentioned above, in the organic transistor of Example of the present invention, a high effective mobility is obtained even with an extremely short channel. Thereby, an organic transistor capable of operating at an extremely high speed can be attained.

Furthermore in Comparative example 3, an organic transistor as shown in FIG. 1 was fabricated. In the organic transistor, the reverse mesa structure was not employed but the interfaces between the gap region 8 and the pedestals 2, 3 were vertical, while all of the dimensions are equivalent to those of FIG. 1. In this case, the source and drain electrodes 4, 5 and the gate electrode 6 were electrically short-circuited.

Next, the method for manufacturing an organic transistor according to the present embodiment will be explained with reference to FIGS. 4A to 4C. It should be noted that the components shown in FIG. 1 are assigned the same reference numbers in order to avoid a duplicated explanation for the structure.

Figure 4A:
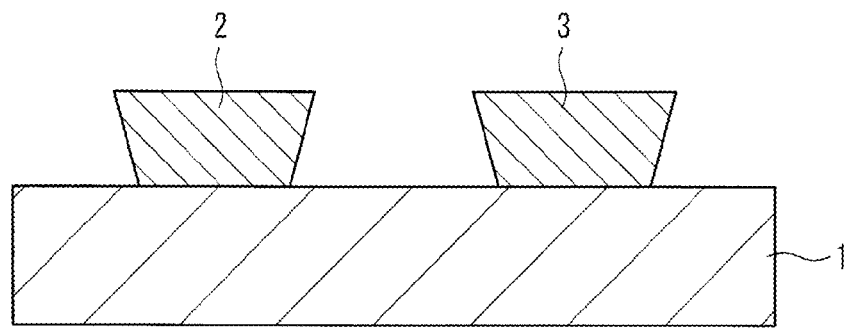
FIG. 4A is a cross-sectional view showing a step in a method for manufacturing the organic transistor.
Figure 4B:
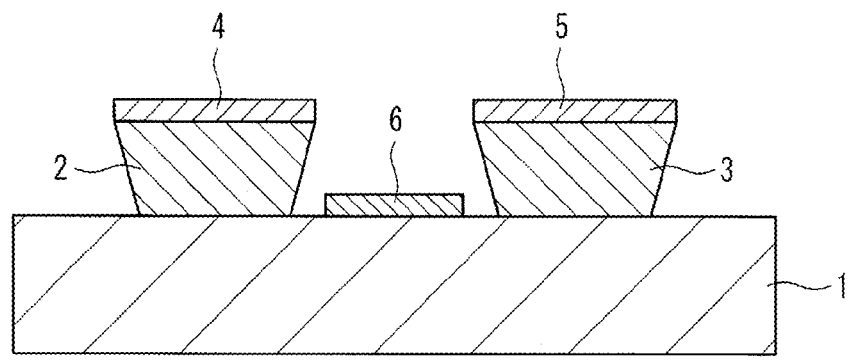
FIG. 4B is a cross-sectional view showing a step subsequent to the step of FIG. 4A in the manufacturing method.

First as shown in FIG. 4A, a pair of insulating pedestals 2. 3 are formed spaced apart from each other on the upper surface of an insulating substrate 1. The pedestals 2, 3 are formed as reverse mesas. Next, as shown in FIG. 4B, a source electrode 4 is formed on one of raised flat surfaces 2a, 3a of the pair of pedestals 2, 3, and a drain electrode 5 is formed on the other, and simultaneously a gate electrode 6 is formed on the substrate 1 between the pedestals 2, 3. Formation of these electrodes is carried out by a deposition method such as vapor deposition or sputtering.

Figure 4C:
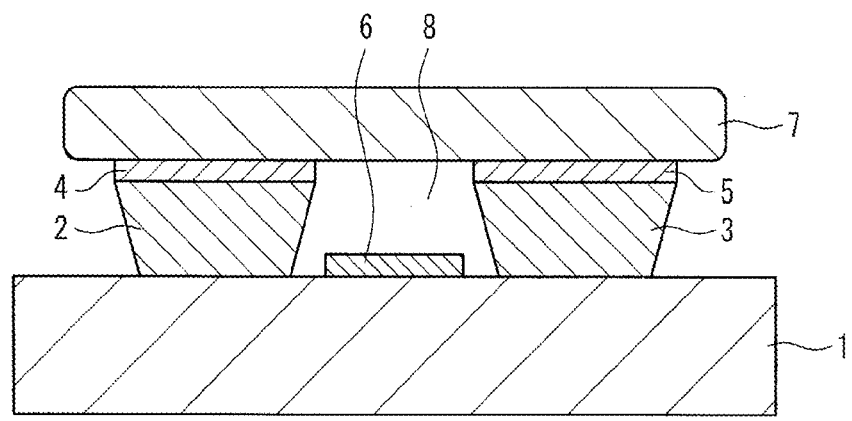
FIG. 4C is a cross-sectional view showing a step subsequent to the step of FIG. 4B in the manufacturing method.

Next, as shown in FIG. 4C, an organic semiconductor layer 7 that has been fabricated in advance is mounted in contact with the upper surfaces of the source electrode 4 and the drain electrode 5, and they are bonded to each other by using electrostatic force. Specifically, the bonding is carried out by contacting or joining the substrate that retains the organic semiconductor layer 7 to a structure on which the source electrode 4 and the drain electrode 5 have been formed. Thereby, an organic transistor having a gap structure is completed, where the gate electrode 6 and the lower surface of the organic semiconductor layer 7 oppose vertically each other across the gap region 8, and the source electrode 4 and the drain electrode 5 oppose each other transversely across the gap region 8.

As mentioned above, according to the manufacturing method of the present embodiment, it is possible to use steps including: previously forming a corrugated structure for the pedestals 2, 3 on the substrate 1; fabricating the electrode structure of the transistor on the corrugated structure; and bonding the electrode structure and the organic semiconductor to each other. According to such a fabrication procedure, the parasitic capacitance is extremely reduced in comparison with an air gap semiconductor fabricated according to the procedure disclosed in Non-Patent Document 1, and the high frequency property of the organic FET is improved. In addition to that, since the risk of short circuit is reduced by virtue of the reverse taper shape or the like, it is easy to form simultaneously the source and drain electrodes 4, 5 and the gate electrode 6 in a batch film formation, and thus effective manufacturing is available. It should be noted however, that the process is not limited to a simultaneous formation, but it is also possible to form the gate electrode 6 separately from the source and drain electrodes 4, 5.

As a method for forming the pedestals 2, 3 as reverse mesas, for example, a photoresist capable of forming a reverse taper shape can be used. Alternatively, for example, it is possible to fabricate the level difference with another material and subsequently form the pedestals 2, 3 with the photoresist or the like such that the pedestals are shaped not as reverse mesas but that only at least a part of each pedestal facing the gap region 8 is shaped as a reverse taper. Or it is possible to form only the upper parts of the pedestals to have a reverse taper shape by controlling the condition for fabrication of the photoresist.

The measure to bond the organic semiconductor layer 7 to the source and drain electrodes 4, 5 is not limited to the electrostatic force, but for example a technique of bonding the structure and the substrate to form contact can be used.

Figure 5:
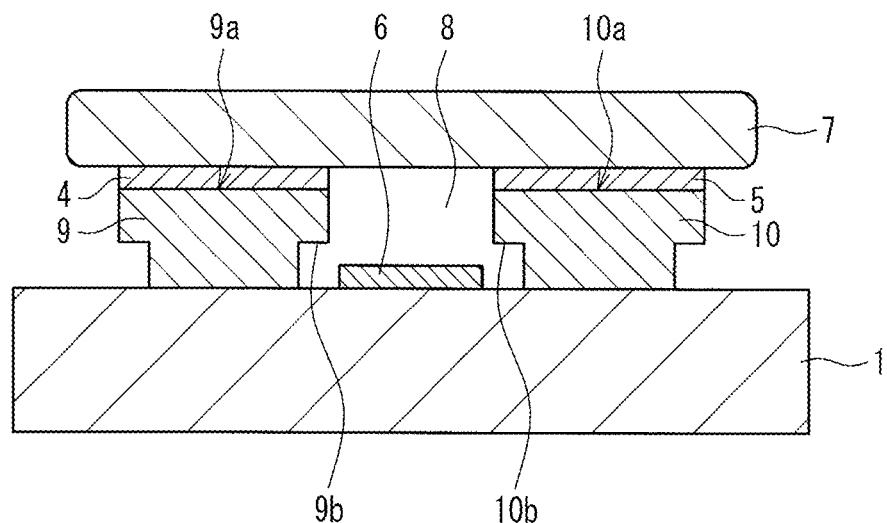
FIG. 5 is a cross-sectional view showing another structural example of the organic transistor.

As mentioned above, the shape of the side surfaces of the pedestals 2, 3 for avoiding short circuit between the electrodes is not limited to the reverse mesa structure or the reverse taper shape. FIG. 5 shows another example of the side surface shape for pedestal. The side surfaces of pedestals 9, 10 facing a gap region 8 in this example are formed as a reverse staircase. A reverse staircase is defined as a shape in which the side surfaces of the pedestals 9, 10 have lower-edge-side areas of a certain height including parts opposing the gate electrode 6, which areas recede with respect to the upper-edge-side area to form stepped parts 9b, 10b.

Due to this reverse staircase shape, the side surfaces of the pedestals 9, 10 facing the gap region 8 are shaped such that the lower side edges recede apart from the gate electrode 6 with respect to the upper side edges. Therefore, by setting the height of the stepped parts 9b and 10b from the upper surface of the substrate 1 to be greater than the thickness of the gate electrode 6, the short circuit between the source and drain electrodes 4, 5 and the gate electrode 6 can be avoided easily.

For the method of forming the reverse staircase pedestals 9, 10, for example, a method of combining two photoresist layers having different development speeds can be used.

In the present embodiment, the dimensions of the pedestals 2, 3, 9 and 10 are set by taking the following conditions into consideration. The channel length L is preferably in the range of 0.1 to 20 μm, and more preferably L=1 to 10 μm. In this case, the pedestal height d is preferably $d \leq L/2$ μm. The reason that the restriction is preferred is as follows. The results of the experiments or the like as illustrated in FIGS. 2, 3 show that, when the channel length L is set to 20 μm or less, employment of the configuration of the organic transistor of the present invention serves to improve remarkably the effective mobility in comparison with the configuration of conventional examples, and thus, effective mobility that is sufficiently high for use is obtained. Although the operation speed can be increased when the channel length L is smaller, the channel length L=1 μm more or less is the limit for the fine processing by photolithography that allows mass production. For the pedestal height d, for the purpose of establishing a so-called gradual channel approximation, $d \leq L/2$ μm more or less is preferable.

For the material for forming the pedestals 2, 3, 9 and 10, any arbitrary material can be used as long as it is an insulator, and as mentioned above, as long as it can be used to form a pedestal such that the side surface of the pedestal facing the gap region 8 has a bottom surface side receding apart from the gate electrode with respect to the raised flat surface side. The examples include etched glass, a combination of two photoresist layers different from each other in the development speed, a laminate of two insulator layers different from each other in size, or a $SiO_2$ film that is formed on a Si substrate and that has been etched to have a reverse taper shape.

In a case of using a film that can form alone a reverse taper pedestal, the advantage is that the fabricating process is simple. Specific examples of the materials to be used include, for the case of photoresist, TLOR-P003 supplied by Tokyo Ohka Kogyo Co., Ltd., AZ5214-E and AZ-CTP supplied by AZ Co., Ltd., SU8 series and KMPR series supplied by Nippon Kayaku Co., Ltd, all of which are registered trade names, and they can be used for forming a reverse taper. Alternatively, it is possible to form a reverse taper by using a mold of Si, quartz etc., in which a resin of a low stiffness such as PDMS resin (polydimethylsiloxane) is poured in and then released to form the pedestal of the present invention.

In a case of forming a pedestal by combining two film layers, the above-mentioned pedestal is shaped easily. Therefore, it is advantageous since the margins for the fabrication conditions are increased and a desired shape can be provided certainly. In a case of fabricating the pedestal of two layers, for example, a photoresist that can be subjected to a formation of undercut such as PMGI, LOR (all of which are registered trade names) supplied by Nippon Kayaku Co., Ltd. can be used.

For the material of the substrate 1, for example, any substrate having at least one insulating surface can be used, and the examples are a glass substrate and various kinds of plastic substrates.

For the organic semiconductor layer 7, any arbitrary organic semiconductor materials can be used, and the examples include: rubrene; low-molecular materials such as DNTT (dinaphtho[2,3-b:2',3'-f]thieno[3,2-b]thiophene), alkyl-DNTT, TIPS pentacene (6,13-Bis(triisopropylsilylethynyl)pentacene), PDIF-$CN_2$ and the like; polymer materials such as pBTTT (poly[2,5-bis(3-alkylthiophen-2-yl)thieno (3,2-b]thiophene]), pDA2T (poly(dialkylthieno[3,2-b]thiophene-co-bithiophene)), P3HT (poly(3-hexylthiophene)), PQT (poly[5,5'-bis(3-alkyl-2-thienyl)-2,2'-bithiophene]) and the like; and various organic materials such as graphene, multilayer graphene, CNT (carbon nanotube) and the like.

In fabrication of the organic semiconductor layer 7, a process of fabricating a single crystal in a gaseous phase, a vapor phase epitaxy such as vapor deposition, a solution process such as spin-coating, inkjet printing, printing, various cast methods and the like can be used.

Embodiment 2

Figure 6:
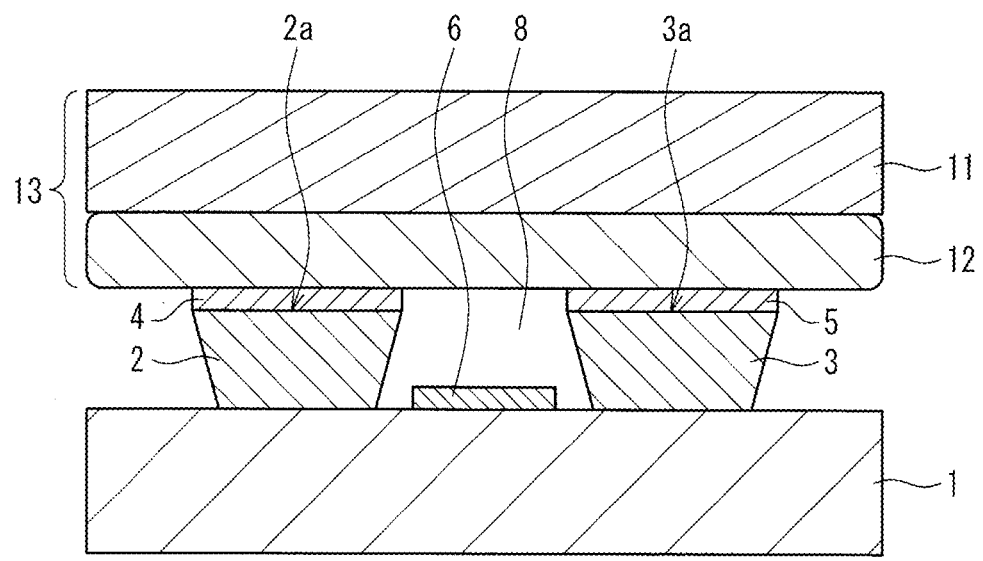
FIG. 6 is a cross-sectional view showing a structure of an organic transistor according to Embodiment 2.

FIG. 6 is a cross-sectional view showing a structure of an organic transistor according to Embodiment 2. This embodiment is characterized in that the organic semiconductor layer 7 in Embodiment 1 is replaced by a semiconductor layer member 13 prepared by forming an organic semiconductor layer 12 on a support substrate 11. Therefore, the components identical to those of Embodiment 1 are assigned the same reference numbers in order to avoid a duplicated explanation.

Similarly to Embodiment 1, this organic transistor has a pair of pedestals 2, 3 formed on an insulating substrate 1. The cross sections of the pedestals 2, 3 have reverse mesa structures. A source electrode 4 and a drain electrode 5 are provided respectively on raised flat surfaces 2a, 3a, and a gate electrode 6 is provided on the substrate 1 in the space between the pedestals 2, 3. A semiconductor layer member 13 is mounted such that the organic semiconductor layer 12 is in contact with the upper surfaces of the source electrode 4 and the drain electrode 5.

Thereby, a space surrounded by the upper surface of the substrate 1, the side surfaces of the pedestals 2, 3 and the lower surface of the organic semiconductor layer 12 are formed, where the gate electrode 6 formed on the substrate 1 opposes the organic semiconductor layer 12 across a gap region 8.

Similarly to Embodiment 1, the cross sections of the pedestals 2, 3 are not limited in particular as long as at least in the gap region 8 the side surfaces form reverse tapers from the bottom surface side toward the raised flat surfaces 2a, 3a. Alternatively, they can be made as reverse staircases as shown in FIG. 5.

The actions and effects provided by the configuration of the present embodiment are similar to those of Embodiment 1.

The method for manufacturing an organic transistor according to the present embodiment will be explained below with reference to FIGS. 7A-7C. It should be noted that the components shown in FIG. 6 are assigned the same reference numbers in order to avoid a duplicated explanation for the structure.

Figure 7A:
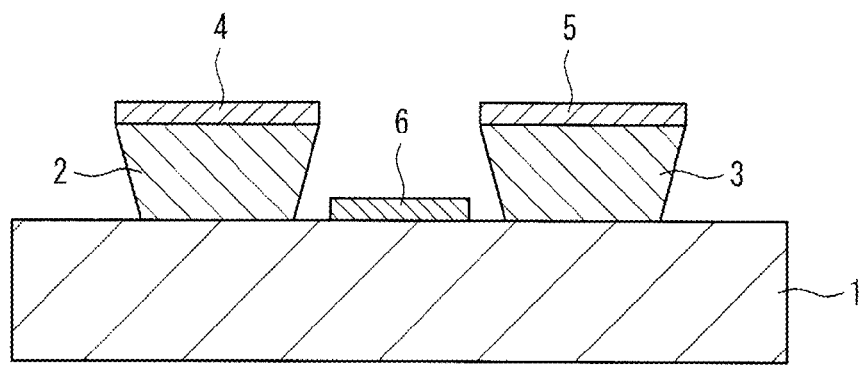
FIG. 7A is a cross-sectional view showing a step in a method for manufacturing the organic transistor.

First, as shown in FIG. 7A, on the upper surface of an insulating substrate 1, a pair of insulating pedestals 2, 3 are formed spaced apart from each other. On one of raised flat surfaces 2a, 3a, a source electrode 4 is formed and a drain electrode is formed on the other, and a gate electrode 6 is formed on the substrate 1 in the space. These steps are similar to the steps as shown in FIGS. 4A and 4B of Embodiment 1.

Figure 7B:
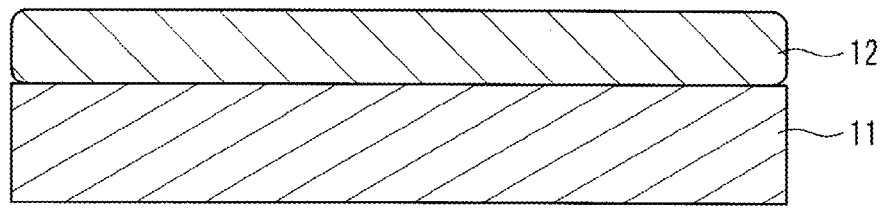
FIG. 7B is a cross-sectional view showing a step subsequent to the step of FIG. 7A in the manufacturing method.

As shown in FIG. 7B, further, a semiconductor member 13 is fabricated by forming an organic semiconductor layer 12 on a support substrate 11. For the purpose of forming the organic semiconductor layer 12, for example, a solution process such as spin-coating, various cast methods, inkjet printing and the like and a vapor phase epitaxy such as vapor deposition and the like can be used.

Figure 7C:
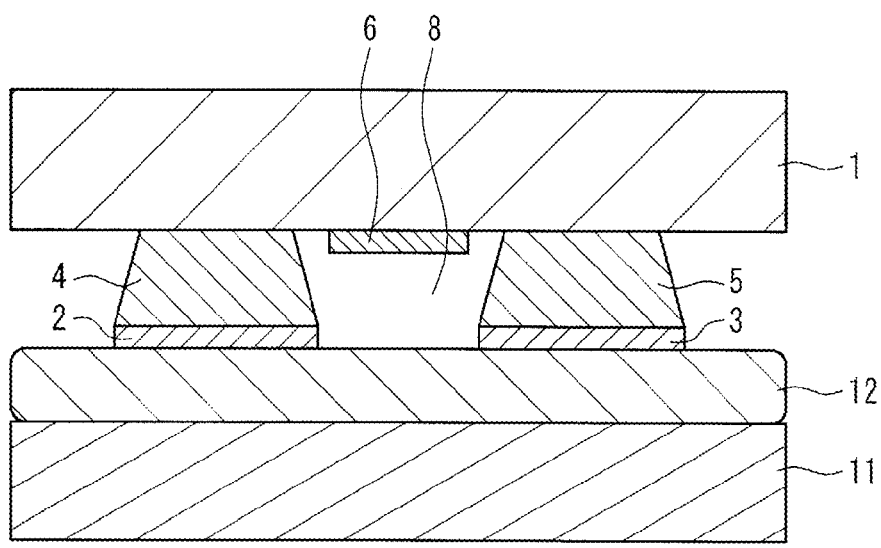
FIG. 7C is a cross-sectional view showing a step subsequent to the step of FIG. 7B in the manufacturing method.

Next, as shown in FIG. 7C, the semiconductor layer member 13 is mounted such that the organic semiconductor layer 12 is in contact with the upper surfaces of the source electrode 4 and the drain electrode, and they are bonded to each other by electrostatic force. Thereby, an organic transistor having a gap structure is completed, in which the gate electrode 6 and the lower surface of the organic semiconductor layer 12 are opposed vertically across the gap region 8, and the source electrode 4 and the drain electrode 5 oppose each other transversely across the gap region 8.

Embodiment 3

Figure 8A:
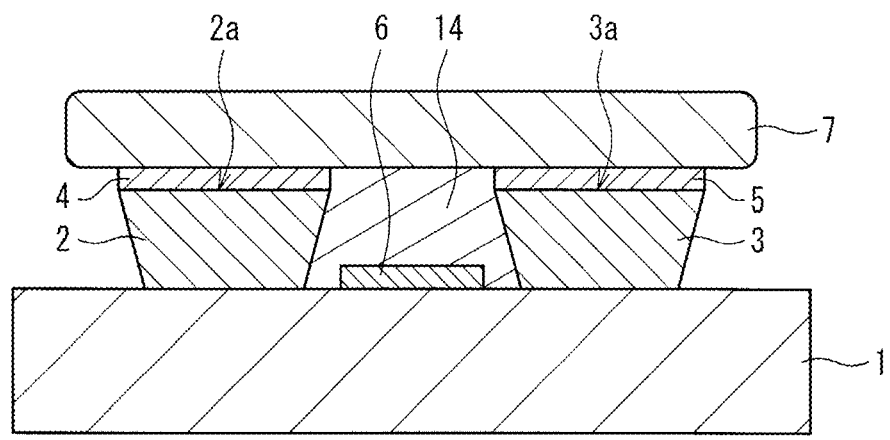
FIG. 8A is a cross-sectional view showing a structure of an organic transistor according to Embodiment 3.
Figure 8B:
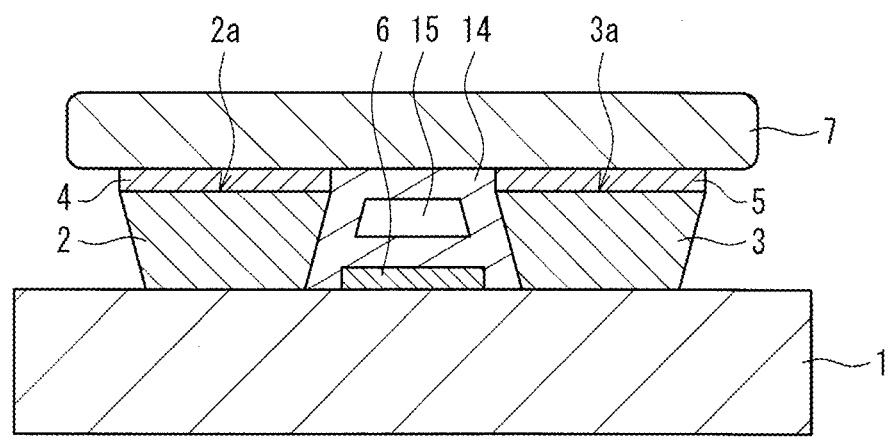
FIG. 8B is a cross-sectional view showing another example of a structure of an organic transistor in the Embodiment.

FIGS. 8A, 8B are cross-sectional views showing a structure of an organic transistor according to Embodiment 3. This embodiment is characterized in that the configuration of Embodiment 1 where the gap region 8 is entirely formed of a gaseous layer is replaced by a configuration that the gap region is formed at least partially of an insulating solid (or sealant). Here, the components identical to those of Embodiment 1 are assigned the same reference numbers in order to avoid a duplicated explanation.

The organic transistor as shown in FIG. 8A is constituted by filling an insulating solid 14 in the entire region corresponding to the gap region 8 (gaseous layer) in the configuration as shown in FIG. 1. The present embodiment is characterized further in that the relative permittivity of the insulating solid 14 in the gap region is greater than 1. Thereby, it is possible to increase the output current of the organic transistor in comparison with the case of the air layer. Examples of the insulating solid 14 to be filled in the gap region include parylene (registered trade mark, paraxylylene-based polymer), polystyrene, an acrylic resin and the like.

The alternative configuration may be like that of the organic transistor shown in FIG. 8B, namely, the gap region may be partially constituted with the insulating solid 14 while allowing a gaseous part 15 to remain. In this case, it is preferable that at least the part in contact with the organic semiconductor layer 7 is formed of the insulating solid 14.

One example of the method for forming the part of the insulating solid 14 in the gap region is as follows. First, similarly to the steps as shown in FIGS. 4A and 4B, a pair of pedestals 2, 3, a source electrode 4, a drain electrode 5 and a gate electrode 6 are formed on an insulating substrate 1. Then, an organic semiconductor layer 7 is arranged on the upper surfaces of the source electrode 4 and the drain electrode 5, thereby fabricating a structure where a space corresponding to the gap region is formed.

Next, a parylene film is formed to seal the structure entirely. Thereby, the space as the gap region is filled with parylene and thus a layer of the insulating solid 14 is formed. At that time, by appropriately setting the amount of the formed parylene film, it is possible to control to form the layer of the insulating solid 14 on the entire gap region as shown in FIG. 8A or to provide a state as shown in FIG. 8B where the gaseous part 15 remains.

Embodiment 4

Figure 9A:
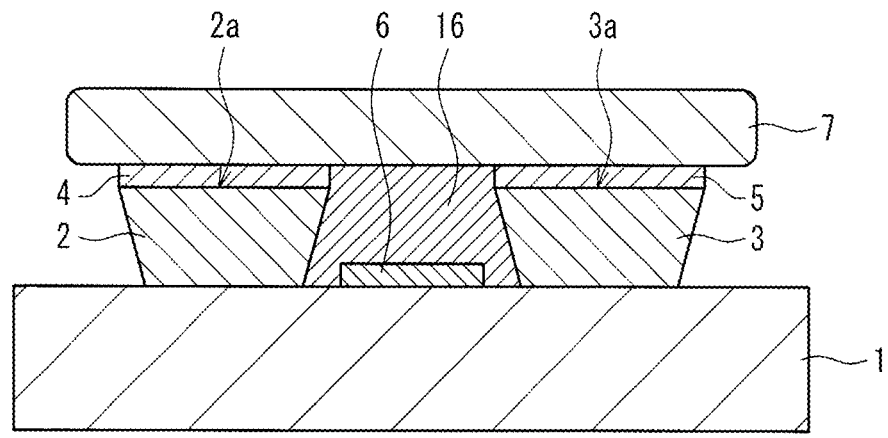
FIG. 9A is a cross-sectional view showing a structure of an organic transistor according to Embodiment 4.
Figure 9B:
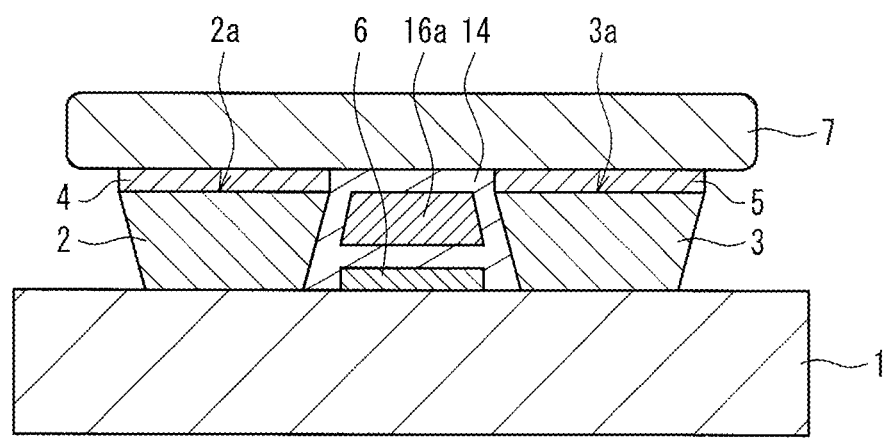
FIG. 9B is a cross-sectional view showing another example of a structure of an organic transistor in the Embodiment.

FIGS. 9A, 9B are cross-sectional views showing a structure of an organic transistor according to Embodiment 4. This embodiment is characterized in that the gap region is at least partially formed of an ionic solid unlike Embodiment 1 where the gap region 8 is entirely formed of a gaseous layer. The components identical to those of Embodiment 1 are assigned the same reference numbers in order to avoid a duplicated explanation.

The organic transistor shown in FIG. 9A has a configuration where the entire region corresponding to the gap region 8 (gaseous layer) in the configuration shown in FIG. 1 is formed of an injected ionic liquid 16.

The organic transistor shown in FIG. 9B has a configuration where at least a part in the gap region 8 of the configuration, which is shown in FIG. 1 and is in contact with the organic semiconductor layer 7, is formed of the insulating solid 14 used in Embodiment 3, as shown in FIG. 8B. In other words, the layer of the insulating solid 14 is formed so that the gaseous part remains in the gap region, and an ionic liquid 16a is injected into the gaseous part.

FIG. 9A shows an example of application for a case where the ionic liquid 16 is used as an gate insulating layer. FIG. 9B shows an example of application for a case where the insulating solid 14 is made as a first gate insulating layer and the ionic liquid 16a is used as a second gate insulating layer. By using the ionic liquid in the gap region, a powerful electric field strength is obtained on the interface. As a result, even when the switching voltage to be applied to the gate electrode (voltage between the gate electrode and both the source electrode and the drain electrode) is low, sufficient output current can be obtained. And thus the power consumption of the electric field effect transistor can be reduced.

Since the ionic liquid has a low viscosity, it can provide a higher frequency response characteristic and a higher ionic conductance when compared to other electrolytes such as a gelled electrolyte. Therefore, application of the ionic liquid in accordance with the configuration of the present embodiment is effective since a high frequency response characteristic is obtained at a lower voltage.

For the ionic liquid, for example, a material formed of a cation such as an imidazolium-based cation, a pyridinium-based cation, an ammonium-based cation and the like and an anion such as bis(trifluoromethanesulfonyl)imide (TFSI), bis(fluorosulfonyl)imide (FSI), bis(perfluoroethylsulfonyl)imide (BETI), tetrafluoroborate (BF4), hexafluorophosphate (PF6) and the like can be used.

In particular, when $EMI(CF_3SO_2)_2N$ is used as the ionic liquid electrolyte, a high response performance is obtained. For example, an organic transistor was produced by using the setting of Example 1 explained in relation to Embodiment 1, where $EMI(CF_3SO_2)_2N$ as the ionic liquid was injected into the structure of channel length L=5 µm. For this organic transistor, the property was measured at the gate voltage=0.2 V and the drain voltage=0.2 V, thereby obtaining a result of the effective mobility of 1.0 $cm^2$/Vs.

According to the organic transistors in the respective embodiments of the present invention as mentioned above, the operation speed of the organic logical element can be increased. Moreover, since it can be formed even on a plastic substrate, the operation speed of the logical element that is operable on a plastic substrate can be increased.

The application examples include high-speed organic logical elements such as an active matrix element for driving a display, a driver circuit for driving an active matrix, an organic pMOS, an organic cMOS circuit, an inverter, an AD/DA converter, a logical element such as a flip-flop circuit, a signal-processing circuit of a sensor device, a signal-processing circuit for an ID tag and the like. Alternatively, it can be applied also to a sensing device using an organic transistor structure. Among them, since the driver circuit or the logic circuit is desired earnestly to operate at a high speed, the effect obtained by the present invention will provide an important advantage in the practical use.

INDUSTRIAL APPLICABILITY

The organic transistor of the present invention is capable of improving sufficiently the high-speed response performance by the shortening of the channel length, and thus it is applied favorably as an organic transistor used for a display, a sensor, an IC card or the like.

EXPLANATION OF LETTERS AND NUMERALS 1 substrate
2,3,9,10 pedestal
2a,3a,9a,10a raised flat surface
4 source electrode
5 drain electrode
6 gate electrode
7,12 organic semiconductor layer
8 gap region
9b,10b stepped part
11 support substrate
13 semiconductor member
14 insulating solid
15 gaseous part
16,16a ionic liquid

The invention claimed is:

1. An organic transistor comprising:
an insulating substrate;
a pair of insulating pedestals arranged spaced apart from each other on the insulating substrate and forming respectively raised flat surfaces;
a source electrode provided on the raised flat surface formed on one of the pedestals;
a drain electrode provided on the raised flat surface formed on the other pedestal;
a gate electrode provided on the insulating substrate between the pair of pedestals; and
an organic semiconductor layer arranged in contact with an upper surface of the source electrode and an upper surface of the drain electrode,
wherein the gate electrode and a lower surface of the organic semiconductor layer oppose each other vertically across a gap region, and
side surfaces of the pedestals facing the gap region are shaped such that the side surfaces increase in distances in a horizontal direction from the gate electrode with decreasing height from upper side edges toward lower side edges of the side surfaces.

2. The organic transistor according to claim 1, wherein the side surfaces of the pedestals facing the gap region form reverse tapers from the lower side edges toward the upper side edges.

3. The organic transistor according to claim 2, wherein each of the pedestals has a cross-sectional shape of a reverse trapezoid so that top surfaces of the pedestals are larger than bottom surfaces of the pedestals.

4. The organic transistor according to claim 1, wherein a portion of each of the pedestals facing the gap region has a recess having a certain height on the lower edge opposing the gate electrode, thereby forming a shape of reverse staircase.

5. The organic transistor according to claim 1, comprising a semiconductor layer member constituted by forming the organic semiconductor layer on a support substrate,
wherein the semiconductor layer member is mounted on the source electrode and the drain electrode, in a state where a surface of the organic semiconductor layer opposes the source electrode and the drain electrode.

6. The organic transistor according to claim 1, wherein at least a part of the gap region is formed of an insulating solid, and the insulating solid has a permittivity greater than 1.

7. The organic transistor according to claim 1, wherein the gap region is entirely formed of an ionic liquid.

8. The organic transistor according to claim 6, wherein at least a part of the gap region to be in contact with the organic semiconductor layer is formed of the insulating solid, and the part other than the insulating solid is formed of an ionic liquid.

9. The organic transistor according to claim 1, wherein a channel length L as a distance between the source electrode and the drain electrode is 20 μm or less.

10. The organic transistor according to claim 9, wherein a height d of the pedestals satisfies a relationship of d <L/2 μm with respect to the channel length L.

11. A method for manufacturing an organic transistor, comprising:
forming on an insulating substrate a pair of insulating pedestals that are spaced apart from each other and that form respectively raised flat surfaces;
forming a source electrode on the raised flat surface formed on one of the pedestals and forming a drain electrode on the raised flat surface formed on the other pedestal, and forming a gate electrode on the insulating substrate between the pair of pedestals;
fabricating a semiconductor layer member by forming an organic semiconductor layer on a support substrate; and
mounting the semiconductor layer member in contact with an upper surface of the source electrode and an upper surface of the drain electrode so that a surface of the organic semiconductor layer opposes the source electrode and the drain electrode, thereby forming a gap region between the gate electrode and the lower surface of the organic semiconductor layer;
wherein in the step of forming the pedestals, the side surfaces of the pedestals facing the gap region are shaped such that the side faces increase in distances in a horizontal direction from the gate electrode with decreasing height from upper side edges toward lower side edges of the side surfaces.

12. The method for manufacturing an organic transistor according to claim 11, wherein the source electrode, the drain electrode and the gate electrode are formed simultaneously by a batch film formation on the pedestals and on the substrate.

* * * * *